(12) United States Patent
Nakamura et al.

(10) Patent No.: US 11,175,332 B2
(45) Date of Patent: Nov. 16, 2021

(54) METHOD FOR MEASUREMENT OF CURRENT-VOLTAGE CHARACTERISTICS

(71) Applicant: Rohm Co., Ltd., Kyoto (JP)

(72) Inventors: Yohei Nakamura, Kyoto (JP); Tatsuya Yanagi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 16/962,897

(22) PCT Filed: Jan. 16, 2019

(86) PCT No.: PCT/JP2019/001026
§ 371 (c)(1),
(2) Date: Jul. 17, 2020

(87) PCT Pub. No.: WO2019/146460
PCT Pub. Date: Aug. 1, 2019

(65) Prior Publication Data
US 2021/0063469 A1 Mar. 4, 2021

(30) Foreign Application Priority Data

Jan. 25, 2018 (JP) .............................. JP2018-010327
Jul. 6, 2018 (JP) .............................. JP2018-129303

(51) Int. Cl.
*G01R 31/26* (2020.01)
(52) U.S. Cl.
CPC ................................ *G01R 31/2621* (2013.01)
(58) Field of Classification Search
CPC ......................... G01R 31/2621; G01R 31/2601
See application file for complete search history.

(56) References Cited

U.S. PATENT DOCUMENTS

2007/0040571 A1 2/2007 Dolian
2007/0182435 A1 8/2007 Lui et al.
(Continued)

FOREIGN PATENT DOCUMENTS

CN 105974293 9/2016
JP 2007-166103 A 6/2007
(Continued)

OTHER PUBLICATIONS

Japan Patent Office, International Search Report for PCT/JP2019/001026 dated Apr. 2, 2019.
(Continued)

*Primary Examiner* — Son T Le
*Assistant Examiner* — Adam S Clarke
(74) *Attorney, Agent, or Firm* — Fish & Richardson P.C.

(57) ABSTRACT

A method for measuring current-voltage characteristics representing the relationship between the drain current and the drain-source voltage of a first transistor includes: a first step of setting the drain current and the drain-source voltage using a voltage source and a current source connected in series with the first transistor and a rectifying element connected in parallel with, with the reverse polarity to, an inductive load as the current source; a second step of measuring the gate-source voltage and the gate current in the switching transient state of the first transistor; and a third step of calculating the voltage applied to the gate oxide film of the first transistor using the results of the measurement of the gate-source voltage and the gate current and acquiring the current-voltage characteristics of the first transistor using the result of the calculation. In the first step, during an excitation period in which an excitation current is passed through the inductive load, part of the excitation current is bypassed through a path that does not pass through the first transistor.

14 Claims, 13 Drawing Sheets

(56) References Cited

U.S. PATENT DOCUMENTS

| 2013/0181723 | A1* | 7/2013 | Mauder | G01R 19/0092 |
| | | | | 324/601 |
| 2013/0229200 | A1* | 9/2013 | Lou | G01R 31/2623 |
| | | | | 324/756.01 |
| 2017/0285095 | A1 | 10/2017 | Yanagi et al. | |
| 2018/0188312 | A1 | 7/2018 | Yanagi et al. | |

FOREIGN PATENT DOCUMENTS

| JP | 2008-164364 A | 7/2008 |
| JP | 2013-108802 A | 6/2013 |
| JP | 2016-164524 A | 9/2016 |
| JP | 2017-181178 | 10/2017 |

OTHER PUBLICATIONS

Chen et al., "Characterization and Modeling of 1.2 kV, 20 A SiC MOSFETs," IEEE Energy Conversion Congress and Exposition, Sep. 2009 , pp. 1480-1487.

Sakairi et al. "Sic-FET Chip Model to Simulate Its Switching Behaviors in High-Voltage and Current Region," The 29th Workshop on Circuits and Systems in Kitakyushy, May 12-13, 2016, pp. 285-290 (with Partial English Translation).

* cited by examiner

METHOD FOR MEASUREMENT OF CURRENT-VOLTAGE CHARACTERISTICS

TECHNICAL FIELD

The invention disclosed in the present description relates to a method for measurement of current-voltage characteristics.

BACKGROUND ART

In creating a device model of a transistor that is used in a computer simulation such as SPICE (simulation program with integrated circuit emphasis), it is absolutely necessary to measure the current-voltage characteristics of the transistor (e.g., the Id-Vds characteristics, which indicate the relationship between the drain current Id and the drain-source voltage Vds of a MOSFET). As a means for measuring current-voltage characteristics, a curve tracer is often used.

A curve tracer acquires the current-voltage characteristics of a transistor by, while applying a predetermined gate-source voltage to the transistor, sweeping the drain-source voltage and measuring the drain current that passes meanwhile. Here, measuring the drain current at a given point requires the application of a pulse as the drain-source voltage for at least several tens of microseconds. Considering high heat generated under high-current, high-voltage conditions, it is impractical to measure the current-voltage characteristics of a transistor used under such conditions.

FIG. 13 is a current-voltage characteristic diagram that shows the measurement range of a curve tracer. With respect to the current-voltage characteristics of, as a measurement target, a power transistor (e.g., a high-withstand-voltage SiC-MOSFET (with a withstand voltage of 1200 V and a peak current of 80 A), solid lines indicate the part that can be measured with a curve tracer and broken lines indicate an example of the parts of which the measurement with a curve tracer is impractical. In the diagram, a dash-and-dot line indicates a locus (load line) that represents the switching transient characteristics observed when an inductive load is connected to the power transistor.

From the diagram, it will be seen that the operating range of the power transistor deviates greatly from the measurement range of the curve tracer. On the load line of the power transistor indicated by the dash-and-dot line in the diagram lies the maximum power point at which a high current and a high voltage are applied simultaneously. It is however difficult to perform measurement in that region with the curve tracer because of the limited power of the device and possible heat generation and destruction of the power transistor.

With a common Si-MOSFET or the like, in its saturation region (e.g., the voltage region where the drain-source voltage is higher than the pinch-off point), the drain current is largely constant. This makes it possible to omit the actual measurement of the current-voltage characteristics in the saturation region by regarding the drain current as constant irrespective of the drain-source voltage.

On the other hand, with a power transistor such as a SiC-MOSFET, because of the short-channel effect resulting from its channel length and the like, even in the saturation range, the current-voltage characteristics have a non-zero gradient (see the broken lines in the diagram). Thus, in acquiring the current-voltage characteristics of a SiC-MOSFET, regarding its drain current in the saturation range as constant as with a Si-MOSFET ends up with results greatly deviated from the actual current-voltage characteristics. This greatly affects the accuracy of the device model.

In view of what has been discussed above, with a power transistor that is used under high-current, high-voltage conditions and of which the electrical characteristics are difficult to estimate, creating an accurate device model requires establishing a novel method for measuring current-voltage characteristics with as low heat generation as possible.

There have conventionally been proposed techniques for acquiring the current-voltage characteristics of a power transistor without the use of a curve tracer. For example, Non-Patent Document 1 achieves current-voltage measurement through switching measurement. There, the voltage applied to the gate oxide film of a Si-MOSFET (which corresponds to the gate-source voltage swept by a curve tracer) is calculated based on the rising time of the drain current, and using the calculated result, the current-voltage characteristics of the SiC-MOSFET are acquired.

CITATION LIST

Patent Literature

Patent Document 1: Japanese Unexamined Patent Application Publication No. 2017-181178.

Non-Patent Literature

Non-Patent Document 1: Z. Chen et. al "Characterization and Modeling of 1.2 kV, 20 A SiC FETs" in Proc. IEEE Energy Conyers. Congr. Expo. (ECCE '09), pp. 1480-1487, September, 2009.

Non-Patent Document 2: H. Sakairi et al. "SiC-FET Chip Models for Simulation of Switching Characteristics in a High-Voltage, High-Current Region". Collection of Papers of Workshop on Circuits and Systems (hosted by the Institute of Electronics, Information and Communication Engineers (IEICE)) 29, 285-290, 2016 May 12.

SUMMARY OF INVENTION

Technical Problem

However, with the conventional technique disclosed in Non-Patent Document 1, the start and end points of the rising time of the drain current are not clearly defined, tending to result in fluctuations in the measurement result. This leaves room for further improvement in terms of measurement accuracy.

The present applicant has been proposing measurement methods (Patent Document 1 and Non-Patent Document 2) with which the current-voltage characteristics of a power transistor can be acquired with low heat generation and high accuracy without the use of a curve tracer. However, these methods do not give sufficient consideration to a heat generation in the power transistor during a coil's excitation period, and leave room for further improvement.

In view of the problems encountered by the present inventors, an object of the invention disclosed in the present description is to provide a method for measuring current-voltage characteristics with low heat generation and high accuracy.

Solution to Problem

A method for measurement of current-voltage characteristics according to one aspect of what is disclosed in the present description is a method for measurement of current-voltage characteristics representing the relationship between the drain current (or collector current) and the drain-source voltage (or collector-emitter voltage) of a first transistor as a measurement target, and includes: a first step of setting the drain current (or collector current) and the drain-source voltage (or collector-emitter voltage) using a voltage source and a current source connected in series with the first transistor and a rectifying element connected in parallel with, with the reverse polarity to, an inductive load serving as the current source; a second step of measuring the gate-source voltage (or gate-emitter voltage) and the gate current in the switching transient state of the first transistor; and a third step of calculating the voltage applied to the gate oxide film of the first transistor using the results of the measurement of the gate-source voltage (or gate-emitter voltage) and the gate current and then acquiring the current-voltage characteristics of the first transistor using the result of the calculation. In the first step, during an excitation period in which an excitation current is passed through the inductive load, part of the excitation current is bypassed through a path that does not pass through the first transistor. (A first configuration.)

In the measurement method of the first configuration described above, preferably, while the first transistor is kept off, at least one second transistor connected in parallel with the first transistor is turned on and thereby the part of the excitation current is bypassed through the second transistor. (A second configuration.)

In the measurement method of the second configuration described above, preferably, the second transistor has a current capacity higher than the current capacity of the first transistor. (A third configuration.)

In the measurement method of any of the first to third configurations described above, preferably, the first and second steps are repeated while the length of the excitation period is varied. (A fourth configuration.)

In the measurement method of any of the first to fourth configurations described above, preferably, in a region of the switching transient state where the drain-source voltage (or collector-emitter voltage) varies, the gate-source voltage (or gate-emitter voltage), the gate current, and the drain current (or collector current) are measured individually. (A fifth configuration.)

In the measurement method of any of the first to fifth configurations described above, preferably, the voltage applied to the gate oxide film of the first transistor is calculated by subtracting from the gate-source voltage (or gate-emitter voltage) measured at a turn-on or turn-off time of the first transistor the result of multiplying the gate current measured at that turn-on or turn-off time of the first transistor by the internal gate resistance of the first transistor. (A sixth configuration.)

In the measurement method of any of the first to fifth configurations described above, preferably, the voltage applied to the gate oxide film of the first transistor is calculated using the ratio of the gate-source voltages (or gate-emitter voltages) measured at both turn-on and turn-off times of the first transistor and the gate currents measured at both those turn-on and turn-off times of the first transistor. (A seventh configuration.)

In the measurement method of any of the first to seventh configurations described above, preferably, an approximation formula of the drain current (or collector current) with respect to the gate-source voltage (or gate-emitter voltage) is derived using the result of the measurement of the drain current and the result of the calculation of the voltage applied to the gate oxide film, and using the approximation formula, the current-voltage characteristics of the first transistor are acquired. (An eighth configuration.)

In the measurement method of any of the first to eighth configurations described above, preferably, the first transistor is a semiconductor device of which the current-voltage characteristics have a non-zero gradient even in the saturation region. (A ninth configuration.)

According to another aspect of what is disclosed in the present description, a measurement device measures the current-voltage characteristics of a first transistor using the measurement method of any one of the first to ninth configurations described above. (A tenth configuration.)

According to yet another aspect of what is disclosed in the present description, a method for creation of a device model includes: parametrizing the current-voltage characteristics of a first transistor measured by the method of any one of the first to ninth configuration described above and thereby creating a device model of the first transistor. (An eleventh configuration.)

According to still another aspect of what is disclosed in the present description, a measurement device includes: a voltage source and an inductive load as a current source that are connected in series with a transistor as a measurement target; at least one switching element connected in parallel with the transistor; and a controller configured to turn on and off the transistor and the switching element. The measurement device is configured to measure the current-voltage characteristics representing the relationship between the drain current (or collector current) and the drain-source voltage (or collector-emitter voltage) of the transistor. The controller is configured, during an excitation period in which an excitation current is passed through the inductive load, to keep the transistor off and meanwhile turn the switching element on to pass the excitation current through the switching element and, after the excitation period, to turn the switching element off and the transistor on to pass a current through the transistor to thereby enable the measurement of the current-voltage characteristics of the transistor. (A twelfth configuration.)

In the measurement device of the twelfth configuration described above, preferably, the transistor is a power (SiC) element through which a current of 20 A or more can be passed and the switching element has a permissible current capacity higher than the permissible current capacity of the transistor. (A thirteenth configuration.)

In the measurement device of the twelfth or thirteenth configuration described above, preferably, there is further provided an externally connected gate resistor connected between the controller and the gate of the transistor. (A fourteenth configuration.)

Advantageous Effects of Invention

According to the invention disclosed in the present description, it is possible to provide a method for measuring current-voltage characteristics with low heat generation and high accuracy.

DESCRIPTION OF EMBODIMENTS

Measurement Device (First Embodiment)

Figure 1:
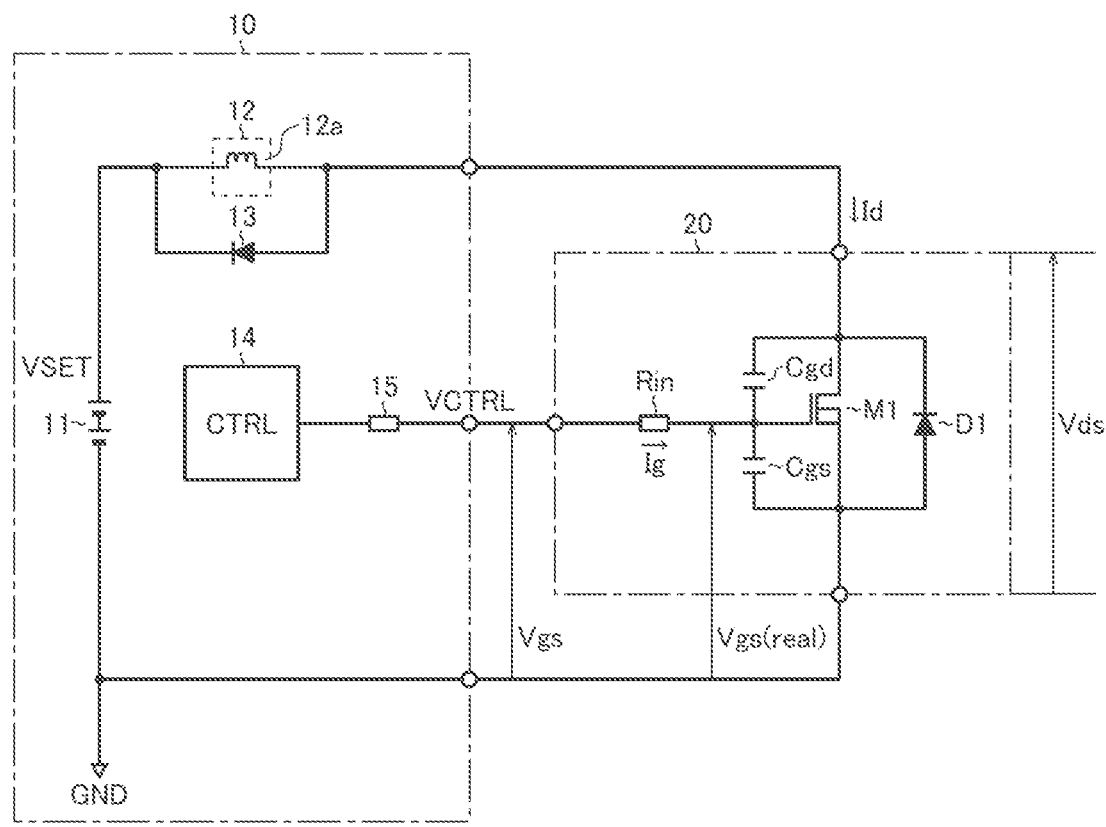
FIG. 1 is an equivalent circuit diagram showing a measurement device according to a first embodiment (comparative example)

FIG. 1 is an equivalent diagram of a measurement device according to a first embodiment (corresponding to a comparative example to be compared with a second embodiment (FIG. 10) described later) for use in measurement of the current-voltage characteristics of a switching element. The measurement device 10 of this embodiment includes a voltage source 11, a current source 12, a diode 13, and a controller 14, and measures the current-voltage characteristics of a switching element 20 (here, the Id-Vds characteristics, which represent the relationship between the drain current Id and the drain-source voltage Vds of the switching element 20). The measurement device 10 also has an externally connected gate resistor 15.

The switching element 20 is a semiconductor switching element as a measurement target (DUT, i.e., device under test) of the measurement device 10, and it is, in the example shown in FIG. 1, an N-channel MOS (metal-oxide-semiconductor) field-effect transistor M1. An example of the transistor M1 of which the current-voltage characteristics should preferably be measured using the measurement device 10 proposed herein is a power transistor (such as a SiC-MOSFET or a GaN power transistor through which a current of 20 A or more can be passed) that is supposed to be used under high-current, high-voltage conditions and of which the current-voltage characteristics have a non-zero gradient ($=\Delta Id/\Delta Vds$) even in the saturation region.

As equivalently shown in FIG. 1, the transistor M1 is accompanied, between the gate and the source, by a gate-source parasitic capacitance Cgs, and is accompanied, between the gate and the drain, by a gate-drain parasitic capacitance Cgd. The input capacitance Ciss of the transistor M1 can be expressed as the sum (=Cgs+Cgd) of the gate-source parasitic capacitance Cgs and the gate-drain parasitic capacitance Cgd.

The transistor M1 is accompanied, at the gate, by an internal gate resistance Rin, and is accompanied, between the drain and the source, a body diode D1 with the illustrated polarity. The transistor M1 is accompanied also by a parasitic inductance, but, for the sake of convenient illustration, it is not illustrated and will not be described.

With respect to the voltages and currents at different parts of the switching element 20, Vgs represents the gate-source voltage, Vgs(real) represents the voltage applied to the gate oxide film (i.e., the actual gate-source voltage), Vds represents the drain-source voltage, Id represents the drain current, and Ig represents the gate current. When the gate current Ig is passing, a voltage (=Ig×Rin) appears between the terminals of the internal gate resistor Rin, and thus Vgs≠Vgs(real). On the other hand, when no gate current Ig is passing, the terminal-to-terminal voltage across the internal gate resistor Rin has a zero value, and thus, if the parasitic capacitance is ignored, Vgs=Vgs(real).

The voltage source 11 is a means for setting the drain-source voltage Vds that is applied to the transistor M1. The connection around it is, specifically, as follows. The positive terminal of the voltage source 11 (i.e., an application terminal for a setting voltage Vset) is connected to the first terminal of the current source 12. The second terminal of the current source 12 is connected to the drain of the transistor M1. The source of the transistor M1 is connected to the negative terminal of the voltage source 11 (i.e., a grounded germinal GND). Thus, the voltage source 11 and the current source 12 are connected in series with the switching element 20. That is, in the illustrated measurement system, the voltage source 11, the current source 12, and the switching element 20 form a closed circuit.

Figure 2:
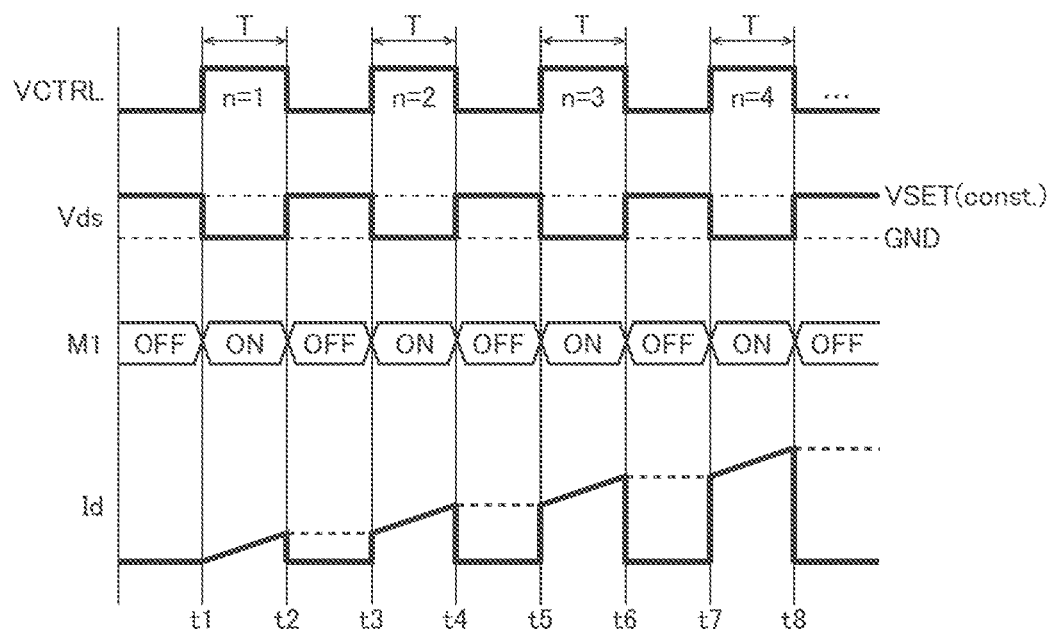
FIG. 2 is a timing chart showing an example of setting of steps in a drain current in the first embodiment.

The current source 12 is a means for setting the current value of the drain current Id that passes during the on-period of the transistor M1. In the illustrated example, used as the current source 12 is a coil 12a (one example of an inductive load). With this configuration, as shown in FIG. 2, by appropriately setting the pulse width T and the pulse count n of the gate-source voltage Vgs (corresponding to the on-period of the transistor M1 and the number of times that it is turned on) and periodically turning on and off the transistor M1, it is possible, while keeping the drain-source voltage Vds applied to the transistor M1 fixed, to switch stepwise the current value of the drain current Id (=(Vds/L)×T×n, where L represents the inductance value of the coil 12a) during switching.

In this embodiment, between the gate and the source of the transistor M1, a control voltage VCTRL is applied. The pulse width T and the pulse count n of the control voltage VCTRL is set appropriately. It is thus possible, while keeping the drain-source voltage Vds applied to the transistor M1 during the on-period fixed, to switch stepwise the current value of the drain current Id during switching.

The measurement device 10 employs a measurement method as follows: at at least one of a turn-on time (see time points t1, t3, t5, and t7 in FIG. 2) and a turn-off time (see time points t2, t4, t6, and t8 in FIG. 2), the gate-source voltage Vgs and the gate current Ig of the transistor M1 in its switching transient state are measured, and based on the measurement results, the Id-Vds characteristics of the transistor M1 are acquired. This will be described in detail later.

With reference back to FIG. 1, the circuit elements constituting the measurement device 10 will be described further.

The diode 13 is a rectifying element (what is generally called a flywheel diode) connected in parallel with, with the reverse polarity to, the current source 12 (i.e., the coil 12a). The connection around it is, specifically, as follows. The cathode of the diode 13 is connected to the first terminal of the current source 12 (i.e., the positive terminal of the voltage source 11). The anode of the diode 13 is connected to the second terminal of the current source 12 (i.e., the drain of the transistor M1). Providing the diode 13 permits, in the off-period of the transistor M1, the current passing through the coil 12a to be regenerated along the path via the diode 13. This prevents an excessive surge voltage from being applied to the transistor M1, and thus prevents device destruction of the transistor M1.

The controller 14 turns on and off the transistor M1 by applying a pulsating voltage as the gate-source voltage Vgs of the transistor M1. In this embodiment, the controller 14 applies a pulsating control voltage VCTRL between the gate and the source of the transistor M1 via the externally connected gate resistor 15.

Though not expressly illustrated, the measurement device 10 is further provided with voltmeters and ammeters for measuring the gate-source voltage Vgs, the drain-source voltage Vds, the drain current Id and the gate current Ig of the transistor M1. At at least a turn-on time or a turn-off time of the transistor M1, the measurement device 10 monitors its switching transient behavior and thereby acquires the Id-Vds characteristics of the transistor M1. The novel measurement method will now be described in detail below.

Switching Transient Characteristics

Figure 3:
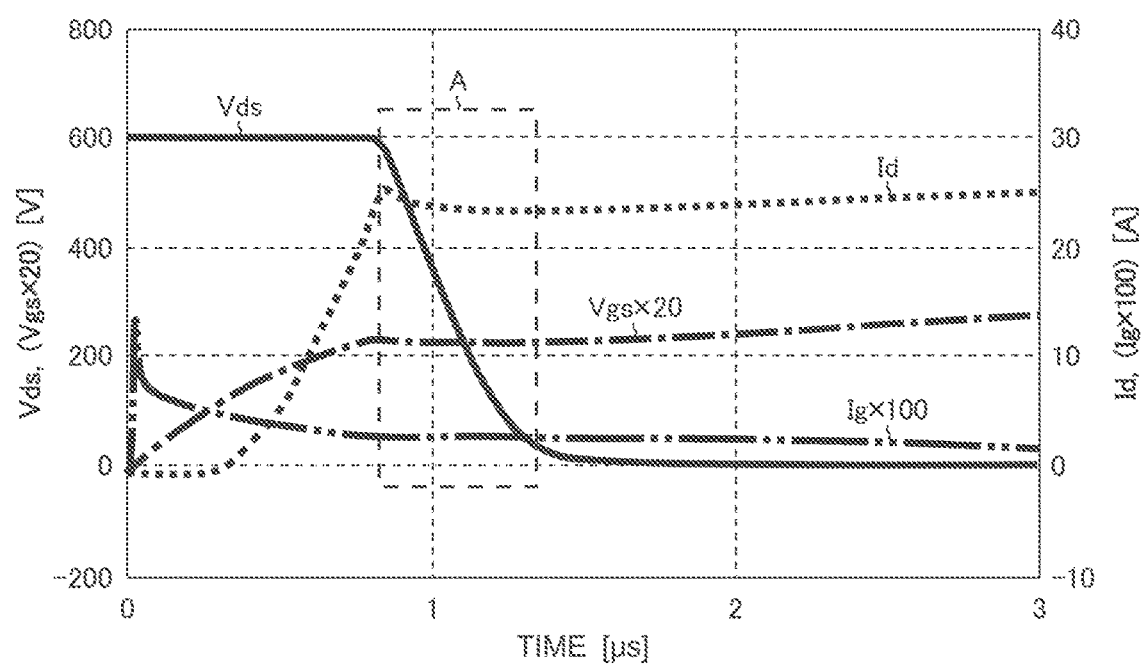
FIG. 3 is a switching waveform diagram of turn-on transient characteristics.
Figure 4:
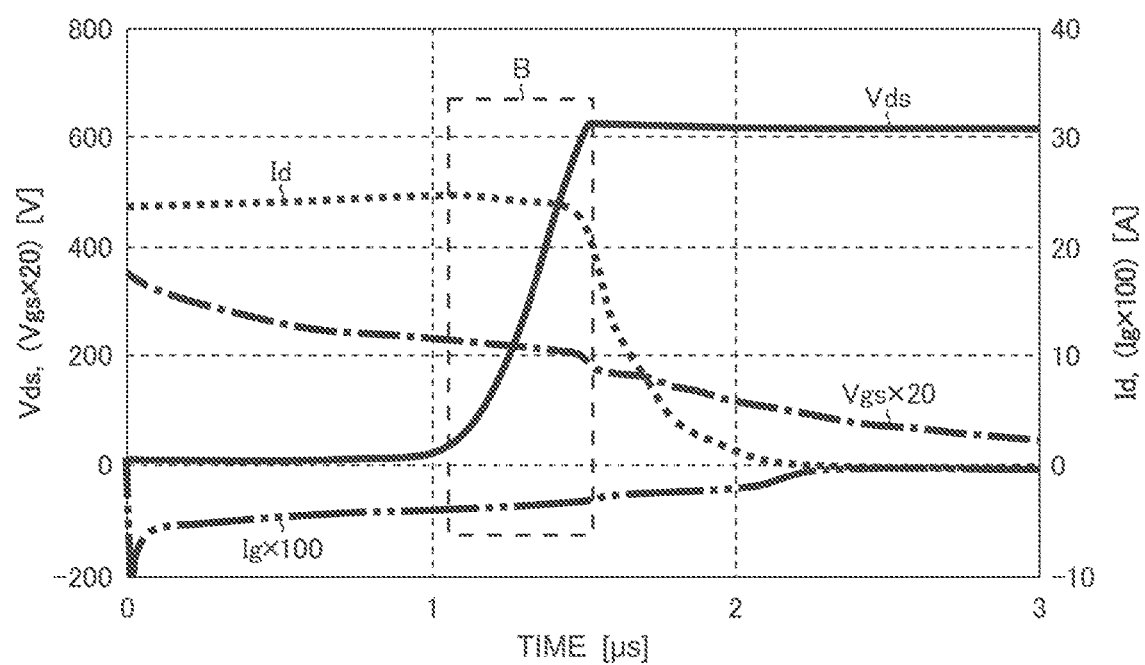
FIG. 4 is a switching waveform diagram of turn-off transient characteristics.

FIGS. 3 and 4 are switching waveform diagrams showing the turn-on switching transient characteristics and the turn-off switching transient characteristics, respectively, of the switching element 20. In those diagrams, a solid line represents the drain-source voltage Vds, a short-stroke broken line represents the drain current Id, a dash-and-dot line represents the gate-source voltage Vgs (×20), and a dash-dot-dot line represents the gate-source voltage Vgs (×100). The scale along the horizontal axis is 1 μs/div. The scale along the left-hand vertical axis is 200 V/div., and the scale along the right-hand vertical axis is 10 A/div. FIG. 3 corresponds to an enlarged diagram around time point t1, t3, t5, or t7, and FIG. 4 corresponds to an enlarged diagram around time point t2, t4, t6, or t8.

Here, the measurement device 10 first sets the drain current Id (in the diagram, 25 A) that passes through the transistor M1 in the on-period and the drain-source voltage Vds (in the diagram, 600 V) that is applied to the transistor M1, and then measures the gate-source voltage Vgs and the gate current Ig in the switching transient state of the transistor M1. Based on the measurement results, the measurement device 10 acquires the Id-Vds characteristics.

The switching transient state of the transistor M1 can be understood as a state where at least one of the drain-source voltage Vds and the drain current Id is in the process of changing, or a state where the gate current Ig is passing.

In the switching transient state, for example, the turn-on transient characteristics are such that, as the drain current Id stops changing, the drain-source voltage Vds starts changing. Accordingly, a high drain-source voltage Vds and a high drain current Id are applied to the transistor M1 only momentarily. The sum Tsw of the respective changing times of the voltage and the current in the switching transient state is as short as 1 μs or less; thus, using the measurement method under discussion causes very low heat generation (=Id×Vds×Tsw/2), and this helps greatly reduce heat generation as compared with applying a conventional measurement method to a high-current, high-voltage region. Accordingly, even with a power device exceeding the measurable range of a curve tracer, it is possible to measure its Id-Vds characteristics in a high-voltage, high-current region. Moreover, with the measurement method under discussion, it is not necessary to consider fluctuation of the characteristics of the transistor M1, and thus it is possible to acquire the Id-Vds characteristics with higher accuracy.

The gate-source voltage Vgs and the gate current Ig can be measured, in the switching transient state of the transistor M1, at a moment that a high current and a high voltage are being applied to it. However, the present inventors have found out that it is preferable to give attention to, within the switching transient state of the transistor M1, the plateau regions A and B where the drain-source voltage Vds changes and measure the gate-source voltage Vgs, the gate current Ig, and the drain current Id individually in those plateau regions A and B.

The plateau regions A and B correspond to the periods where the actual gate-source voltage Vgs(real) is equal to a plateau voltage Vp. In these plateau regions A and B, while the gate-source voltage Vgs and the gate current Ig are held, only the drain-source voltage Vds changes.

In particular, when the transistor M1 is switched at a sufficiently low speed, the measured values of the gate-source voltage Vgs and the gate current Ig remain constant (or largely constant) in the plateau regions A and B. Thus, in the plateau regions A and B, the gate-source voltage Vgs and the gate current Ig can be read easily and accurately as compared with in any other region, and this contributes to enhancing the measurement accuracy of the Id-Vds characteristics that are eventually obtained. The switching speed of the transistor M1 can be adjusted appropriately, for example, using the gate resistor 15.

To enhance the measurement accuracy of the Id-Vds characteristics, it is preferable to measure the gate-source voltage Vgs and the gate current Ig a plurality of times in the plateau regions A and B and calculate the average values to obtain the definitive detection values.

As described above, with the measurement method proposed herein, it is possible to measure the Id-Vds characteristics of the transistor M1 with lower heat generation and higher accuracy than with a conventional curve tracer.

However, since the gate current Ig is passing in the switching transient state of the transistor M1, between the gate-source voltage Vgs measured by the measurement device 10 and the gate-source voltage Vgs set by a curve tracer (i.e., the gate-source voltage Vgs(@Ig=0) observed when the gate current Ig has a zero value), there arises a difference that corresponds to the terminal-to-terminal voltage (=Ig×Rin) across the internal gate resistor Rin. This makes it difficult to acquire correct Id-Vds characteristics using the measured value of the gate-source voltage Vgs as it is.

To cope with that, in the measurement device 10, in the switching transient state of the transistor M1, the gate current Ig is measured along with the gate-source voltage Vgs and using those individual measurement results, the actual gate-source voltage Vgs(real) is calculated.

In the path across which the gate current Ig passes, the wiring conductor has a parasitic inductance. However, this does not need to be given consideration when calculating the actual gate-source voltage Vgs(real) applied to the gate oxide film because, in the plateau regions A and B, the gate current Ig does not change (it remains constant).

The actual gate-source voltage Vgs(real) is equivalent to the terminal-to-terminal voltage across the gate-source parasitic capacitance Cgs, and hence is equivalent to the gate-source voltage Vgs(@ig=0) set by a curve tracer. Accordingly, by using, instead of the measured value of the gate-source voltage Vgs as it is, the calculated value of the actual gate-source voltage Vgs(real), it is possible to acquire correct Id-Vds characteristics. Processing for calculating the actual gate-source voltage Vgs(real) will be described in detail below.

Vgs(real) Calculation Processing

When using the internal gate resistor Rin of the transistor M1, it is advisable to calculate the actual gate-source voltage Vgs(real) from the gate-source voltage Vgs and the gate current Ig that are measured at a turn-on or turn-off time of the transistor M1.

For example, in a case where the measurement results obtained at a turn-on time of the transistor M1 are used, it is possible to calculate, by subtracting from the gate-source voltage Vgs,on measured at the turn-on time the result of multiplying the gate current Ig,on measured at the same turn-on time by the internal gate resistor Rin of the transistor M1, the actual gate-source voltage Vgs(real) that is applied to the gate oxide film of the transistor M1. This calculation processing can be expressed by formula (1) below.

$$Vgs(real) = Vgs,on - Ig,on \times Rin \quad (1)$$

Or, in a case where the measurement results obtained at a turn-off time of the transistor M1 are used, it is possible to calculate, by subtracting from the gate-source voltage Vgs,off measured at the turn-off time the result of multiplying the gate current Ig,off measured at the same turn-off time by the internal gate resistor Rin of the transistor M1, the actual gate-source voltage Vgs(real) that is applied to the gate oxide film of the transistor M1. This calculation processing can be expressed by formula (2) below.

$$Vgs(real) = Vgs,off - Ig,off \times Rin \quad (2)$$

On the other hand, when not using the internal gate resistor Rin of the transistor M1, it is possible to calculate, using the ratio of the gate-source voltages Vgs,on and Vgs,off measured at both the turn-on and turn-off times of the transistor M1 and the gate currents Ig,on and Ig,off measured at both those the turn-on and turn-off times of the transistor M1, to calculate the actual gate-source voltage Vgs(real). This calculation processing can be expressed by formula (3) below.

$$Vgs(real) = \{(Vgs,off \times Ig,on) - (Vgs,on \times Ig,off)\}/(Ig,on - Ig,off) \quad (3)$$

Formula (3) above can be derived by combining together formulae (1) and (2) noted previously and eliminating the internal gate resistor Rin.

The internal gate resistor Rin has a frequency dependence, and this makes it difficult to grasp its value during operation. To cope with that, in the calculation processing described above, the internal gate resistor Rin is eliminated so that it is possible, using the ratio (i.e., [Ig,on/(Ig,on−Ig,off)], [Ig,off/(Ig,on−Ig,off)]) of the gate currents Ig,on and Ig,off in the plateau regions at the turn-on and turn-off times of the transistor M1, to calculate the actual gate-source voltage Vgs(real) from actually measured values alone, and thereby to achieve enhanced accuracy

Vgs(real) Interpolation Processing

Figure 5:
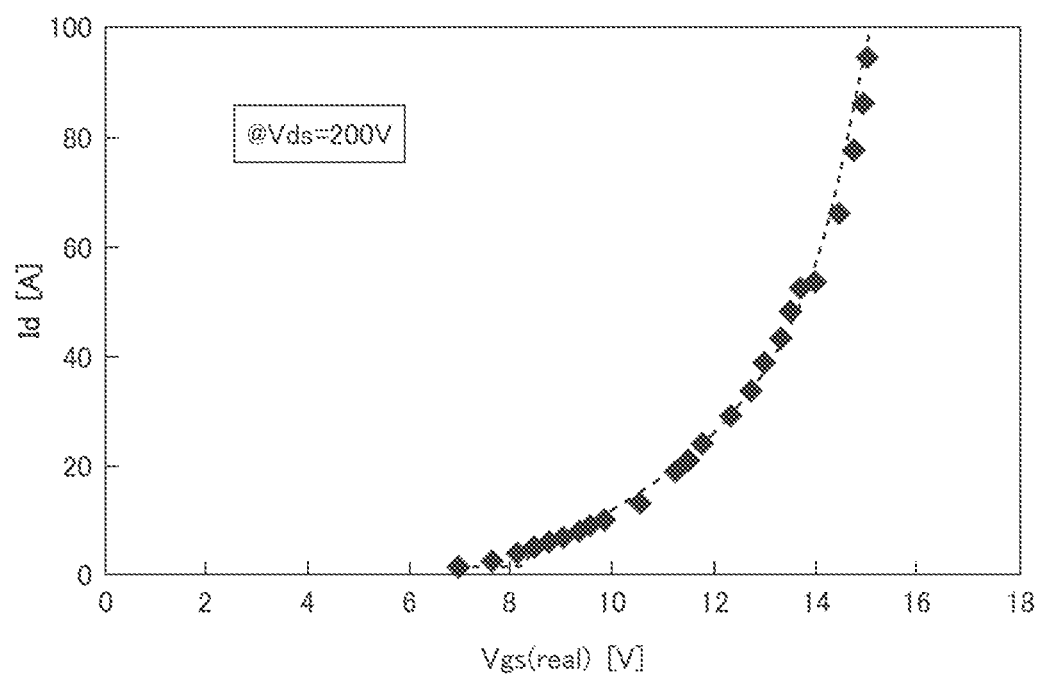
FIG. 5 is an Id-Vgs characteristic diagram obtained by the measurement method proposed herein.

FIG. 5 is an ID-Vgs(real) characteristic diagram showing a relationship between the drain current Id and the actual gate-source voltage Vgs(real). The diagram shows the Id-Vds(real) characteristics observed when the drain-source voltage Vds is held at 200 V.

In the measurement device 10, using the measurement result of the drain current Id and the calculation result of the actual gate-source voltage Vgs(real), the Id-Vds(real) characteristics are derived. Here, the calculated value of the actual gate-source voltage Vgs(real) distributes discretely as indicated by rhombic symbols in the diagram, and does not always agree with the voltage value set at predetermined intervals using a curve tracer.

To cope with that, in the measurement device 10, as indicated by a broken line in the diagram, an approximation formula of the drain current Id with respect to the actual gate-source voltage Vgs(real) is derived, and using this formula, interpolation processing for the actual gate-source voltage Vgs(real) is performed. One method of acquiring such an approximation formula is, for example, approximating a set of data with a polynomial of nth order by the least-squares method.

Through such interpolation processing, it is possible to correlate the actual gate-source voltage Vgs(real) at predetermined intervals with the drain current Id, and thereby to acquire Id-Vds characteristics equivalent to those obtained conventionally.

Figure 6:
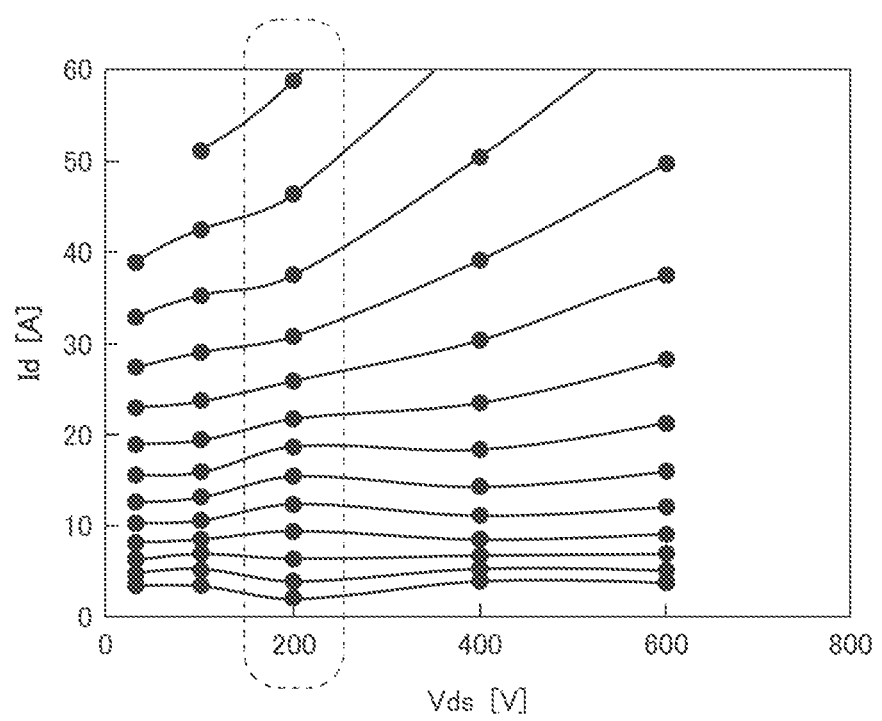
FIG. 6 is an Id-Vds characteristic diagram obtained by the measurement method proposed herein.

FIG. 6 is an Id-Vds characteristic diagram of the transistor M1 that is eventually obtained by the measurement method described above. For example, the group of measurement points (black circular symbols) enclosed by a broken line in the diagram is a re-plotting of the drain current Id corresponding to the actual gate-source voltage Vgs(real) at predetermined intervals based on the approximation formula of the Id-Vds characteristics indicated by a broken line in FIG. 5. As shown in FIG. 6, by the measurement method proposed herein, it is possible to acquire an Id-Vds characteristic diagram (corresponding to "current-voltage characteristics representing the relationship between the drain current and the drain-source voltage of a first transistor" in the present invention) like one obtained with a curve tracer.

In creating a device model of the transistor M1 it is advisable to parametrize the Id-Vds characteristics measured by the measurement method proposed herein and include them in the equivalent circuit description of a device model. It is thus possible to faithfully reproduce the behavior of the transistor M1 in a simulation, and hence to enhance the accuracy of the simulation.

Figure 7:
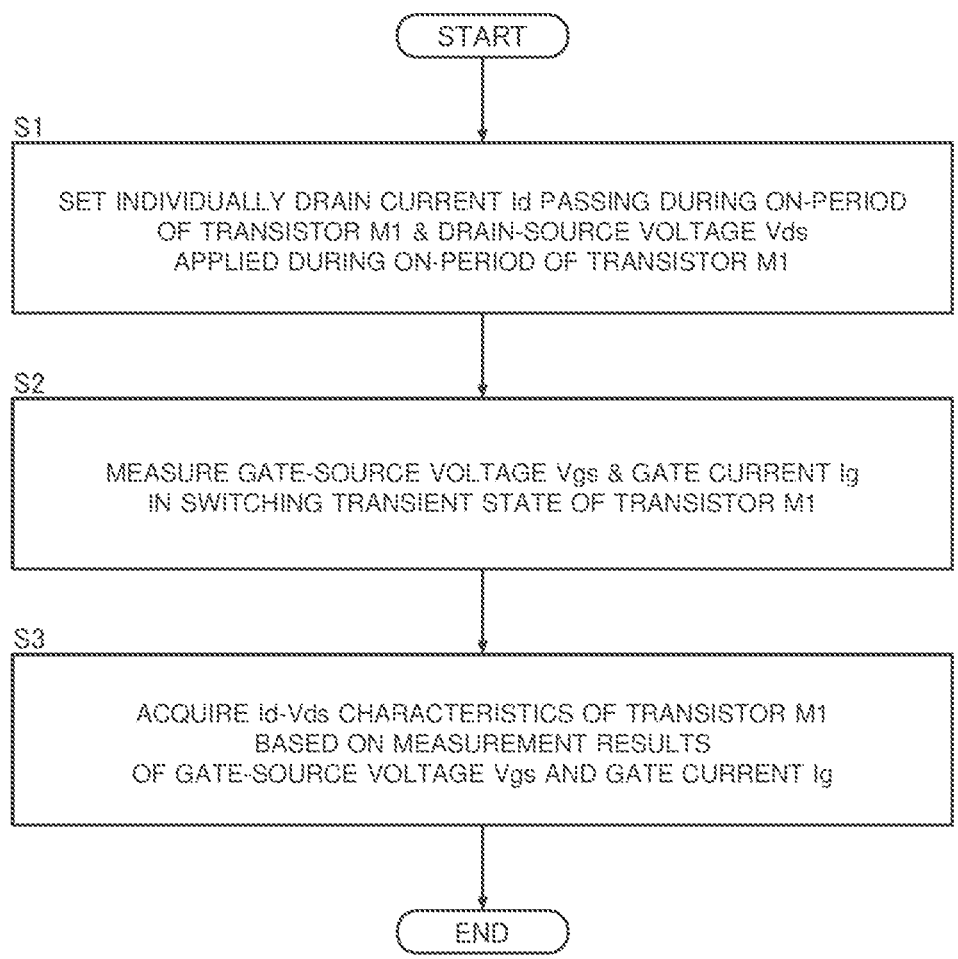
FIG. 7 is a flow chart showing a method for measurement of Id-Vds characteristics.

FIG. 7 is a flow chart showing the method described above for measurement of Id-Vds characteristics. First, at step S1, the drain current Id that passes in the on-period of the transistor M1 and the drain-source voltage Vds that is applied in the on-period of the transistor M1 are individually set.

Next, at step S2, the gate-source voltage Vgs and the gate current Ig in the switching transient state of the transistor M1 are measured.

Lastly, at step S3, based on the measurement results of the gate-source voltage Vgs and the gate current Ig, the Id-Vds characteristics of the transistor M1 are acquired.

Heat Generation in a DUT During an Excitation Period

Figure 8:
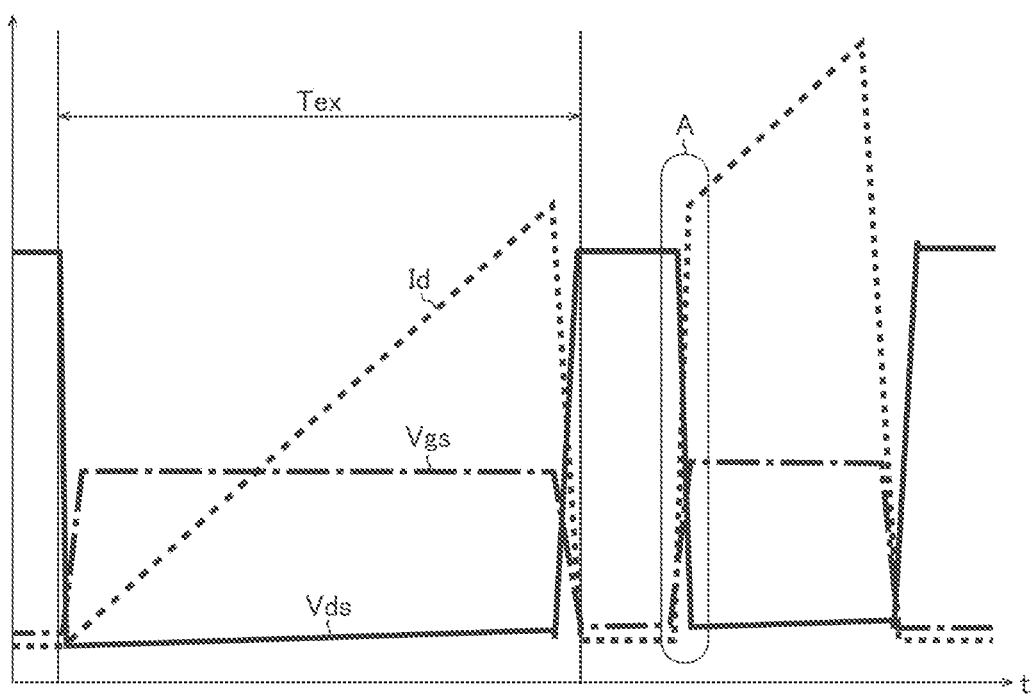
FIG. 8 is a switching waveform diagram in the first embodiment.

FIG. 8 is a switching waveform diagram in the first embodiment, where, as in FIGS. 3 and 4 referred to previously, a solid line represents the drain-source voltage Vds, a short-stroke broken line represents the drain current Id, and a dash-and-dot line represents the gate-source voltage Vgs.

In the diagram, the frame line A indicates the measurement region (corresponding to the plateau region A mentioned previously) in which the gate-source voltage Vgs, the gate current Ig, and the drain current Id are measured individually, and in an excitation period Tex preceding it, an excitation current is passed through the coil 12a to set the drain current Id.

Here, in the measurement device 10 of the first embodiment, the switching element 20 (i.e., the transistor M1), which is the DUT, is turned on to pass an exciting current through the coil 12a. Accordingly, in the excitation period Tex of the coil 12a, a conduction loss in the switching element 20 occurs. Moreover, in the turn-off period immediately after the excitation period Tex, also a switching loss in the switching element 20 occurs. In particular, in the measurement device 10, which performs measurement with a high current, heat generation in the switching element 20 resulting from the above-mentioned losses (i.e., conduction loss plus switching loss) often cannot be ignored.

Figure 9:
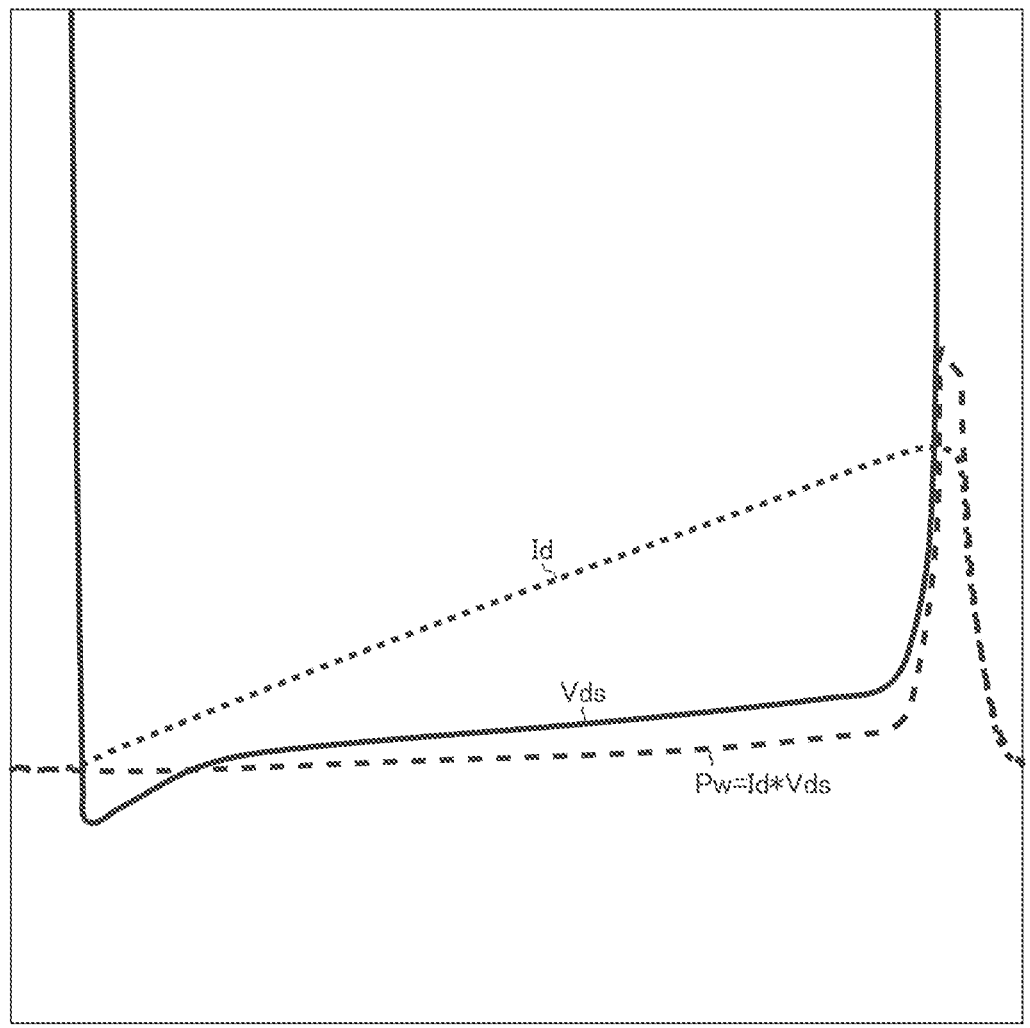
FIG. 9 is an enlarged view of an excitation period.

FIG. 9 is an enlarged view of the excitation period Tex in FIG. 8, and shows, in addition to the drain-source voltage Vds (solid line) and the drain current Id (short-stroke broken line), the loss Pw (=Id×Vds) in the excitation period Tex.

In a case where the supply voltage is several hundred volts and the excitation current is several tens of amperes, a loss Pw (i.e., conduction loss plus switching loss) of several hundred watts to several kilowatts occurs during the excitation period Tex. If the switching element 20 generates heat due to the loss PW and the temperature of its junction rises, the characteristics of the transistor M1 change, and this may adversely affect the measurement accuracy of the Id-Vds characteristics.

For example, in a case where the supply voltage is 600 V and the excitation current is 50 A, the loss in the excitation period Tex is 57 mJ, and the loss at the turn-on time (during measurement) is 20 mJ. Thus, the total loss up to the time point of measurement is 95 mJ. With the excitation current increased to 100 A, the loss in the excitation period Tex is 420 mJ and the loss at the turn-on time (during measurement) is 150 mJ. Thus, the total loss up to the time point of measurement is 570 mJ. As described above, the higher the excitation current, the higher the loss in the switching element 20, and hence the more notable the heat generation in the switching element 20.

Just for information, the loss that arises during measurement at 20 V/20 A (with a pulse width of 200 µs) is 80 mJ.

Proposed below will be a second, novel, embodiment that can eliminate heat generation as mentioned above in the DUT during the excitation period.

Measurement Device (Second Embodiment)

Figure 10:
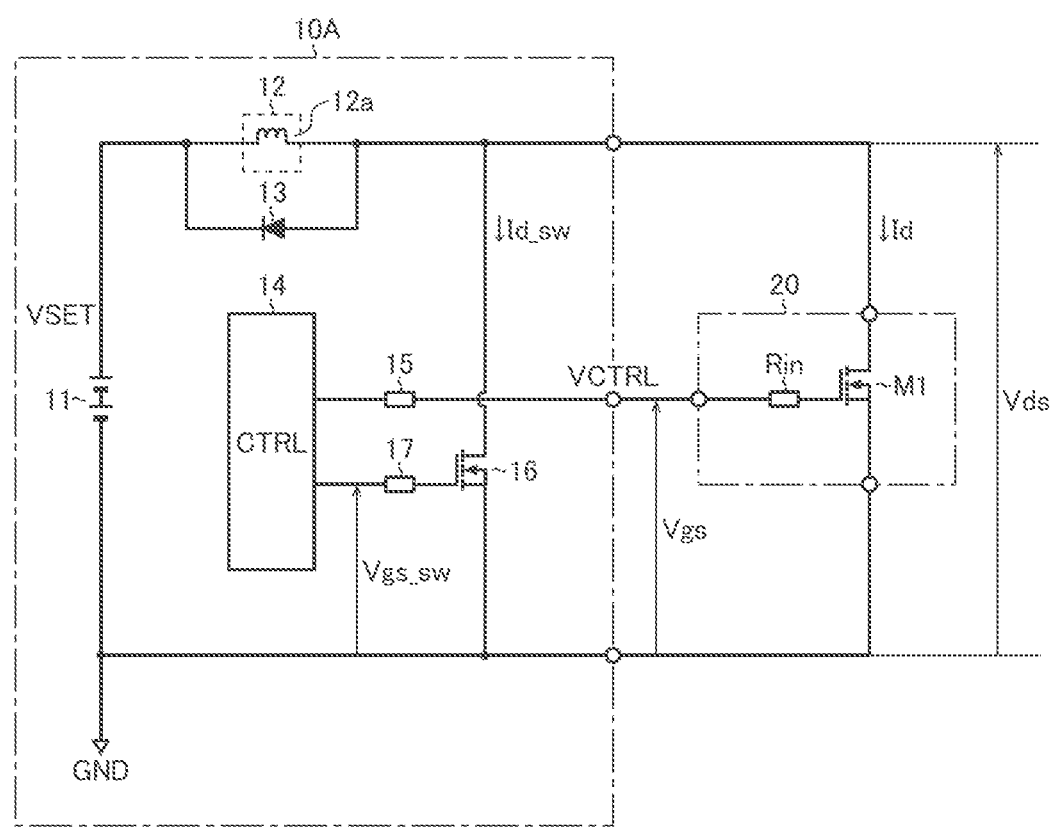
FIG. 10 is an equivalent circuit diagram of a measurement device according to a second embodiment.

FIG. 10 is an equivalent diagram of a measurement device according to a second embodiment for use in measurement of the current-voltage characteristics of a switching element. The measurement device 10A of this embodiment includes an N-channel MOS field effect transistor 16 (corresponding to a second transistor), which functions as a switching element for passing an excitation current through the coil 12a, and a gate resistor 17. Accordingly, those elements which have already been described are identified by the same reference signs as in FIG. 1, and no overlapping description will be repeated. The following description focuses on differences.

The transistor 16 is connected in parallel with the switching element 20 (i.e., the transistor M1), which is the DUT. More specifically, the drain of the transistor 16 is, along with the drain of the transistor M1, connected to one terminal of the coil 12a. The source of the transistor 16 is, along with the source of the transistor M1, connected to the negative terminal of the voltage source 11 (i.e., a grounded terminal GND). The gate of the transistor 16 is connected via the gate resistor 17 to the controller 14.

The controller 14 pulse-drives the gate-source voltage Vgs of the transistor M1 to turn on and off the transistor M1, and pulse-drives the gate-source voltage Vgs_sw of the transistor 16 to turn on and off the transistor 16. In this embodiment, the controller 14 applies a pulsating control voltage VCTRL between the gate and the source of the transistor M1.

Figure 11:
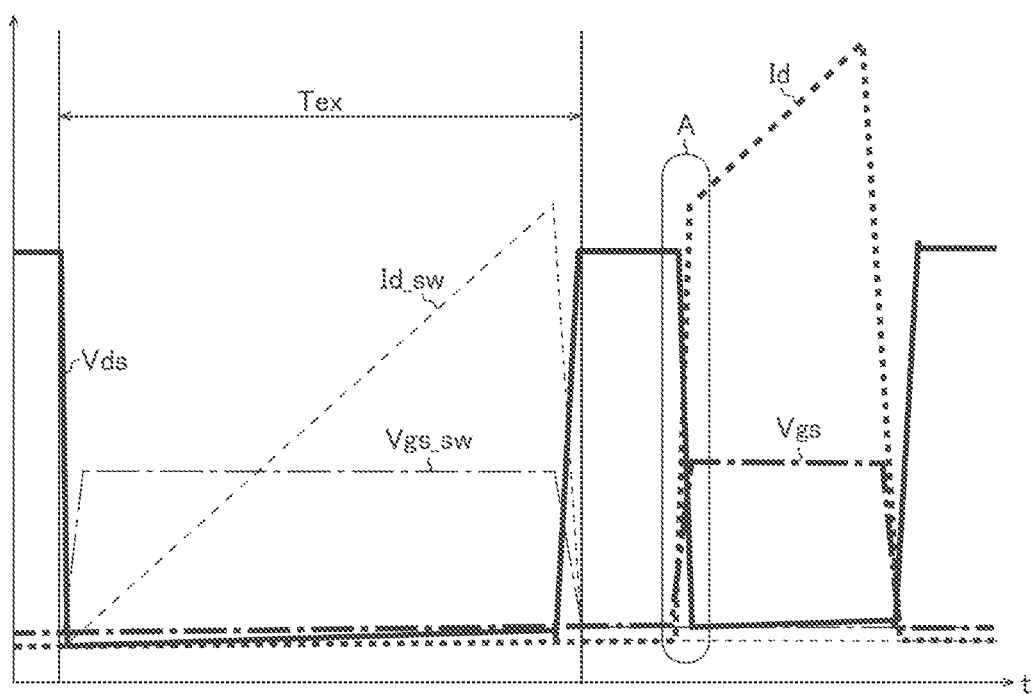
FIG. 11 is a switching waveform diagram in the second embodiment.

FIG. 11 is a switching waveform diagram in the second embodiment, where a thick solid line represents the drain-source voltage Vds of the transistor M1 (and of the transistor 16). A thick short-stroke broken line represents the drain current Id of the transistor M1, and a thick dash-and-dot line represents the gate-source voltage Vgs of the transistor M1. A thin short-stroke line represents the drain current Id_sw of the transistor 16, and a thin dash-and-dot line represents the gate-source voltage Vgs_sw of the transistor 16.

In the diagram, the frame line A indicates the measurement region (corresponding to the plateau region A mentioned previously) in which the gate-source voltage Vgs, the gate current Ig, and the drain current Id are measured individually and, in an excitation period Tex preceding it, an excitation current is passed through the coil 12a to set the drain current Id. This proceeds in a similar manner as in FIG. 8 referred to previously.

However, in the measurement device 10 of this embodiment, unlike in the first embodiment described previously, the excitation current (i.e., the drain current Id_sw) is passed through the coil 12a by turning on the transistor 16 while keeping the switching element 20 (i.e., the transistor M1) as the DUT off. That is, in the excitation period Tex of the coil 12a, the excitation current is not only passed through the transistor M1 but is also bypassed through the transistor 16. Thus, no conduction loss or switching loss occurs in the transistor M1.

For example, in a case where the supply voltage is 600 V and the excitation current is 50 A, the loss of 75 mJ in the excitation period Tex does not occur in the transistor M1. Accordingly, the total loss that occurs in the transistor M1 up to the time point of measurement is only 20 mJ (=the loss at the turn-on time).

Thereafter, when the excitation current of the coil 12a (i.e., the drain current Id_sw) increases up to a desired value, the transistor 16 is turned off and then, by turning on the transistor M1, the gate-source voltage Vgs, the gate current Ig, and the drain current Id in the plateau region A are measured individually.

In this way, with the measurement device 10 of this embodiment, it is possible to increase the excitation current through the coil 12a up to the desired value without passing the drain current Id through the transistor M1 the DUT. Thus, as compared with the first embodiment (FIG. 1) described previously, it is possible to restrain the heat generation by the transistor M1 itself, and hence to enhance the measurement accuracy of the Id-Vds characteristics without causing unintended fluctuation of the characteristics of the transistor M1 resulting from a rise in the junction temperature.

For example, as compared with the curve tracer (at 20 V/20 A, a pulse width of 200 µs) mentioned previously, with comparable heat generation, it is possible to perform measurement at 600 V/100 A.

As a means for switching between a conducting and a cut-off state the bypass for passing the excitation current through the coil 12a, a transistor 16 of the same kind as the transistor M1 (in the illustrated example, both are NMOS-FETs) can be used. This configuration permits a single controller 14 to be shared.

It is preferable that the transistor 16 be designed to have a current capacity higher than that of the transistor M1. With such a device design, it is possible to measure the Id-Vds characteristics of a transistor over a wider measurement range.

However, the specific configuration of the measurement device 10 is not limited to the one described above that employs a transistor 16, and any other configuration can be adopted so long as the excitation current can be bypassed, in the excitation period Tex of the coil 12a, through a path that does not pass through the transistor M1. For example, while FIG. 10 shows a configuration where a single transistor 16 is connected in parallel with the transistor M1, two or more transistors 16 can instead be connected in parallel there.

Measurement Sequence

Figure 12:
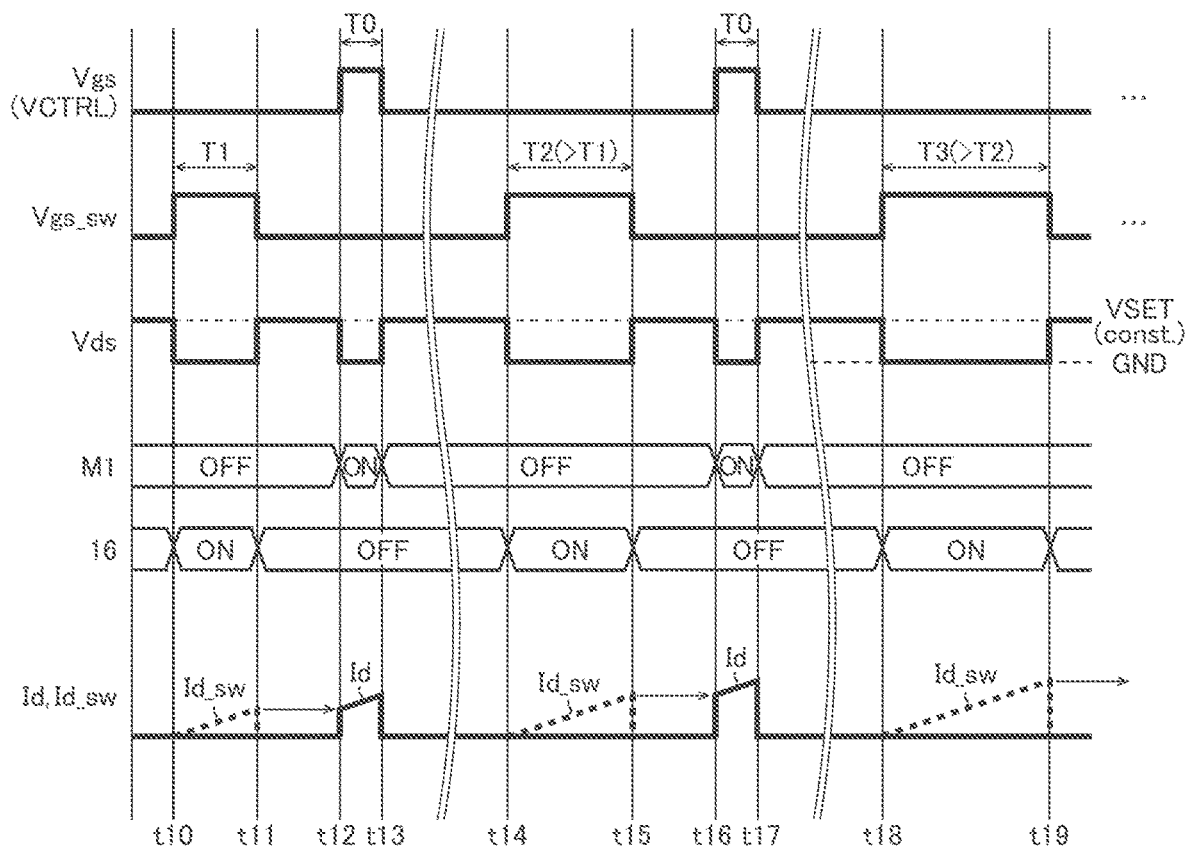
FIG. 12 is a timing chart showing an example of setting of steps in a drain current in the second embodiment.
Figure 13:
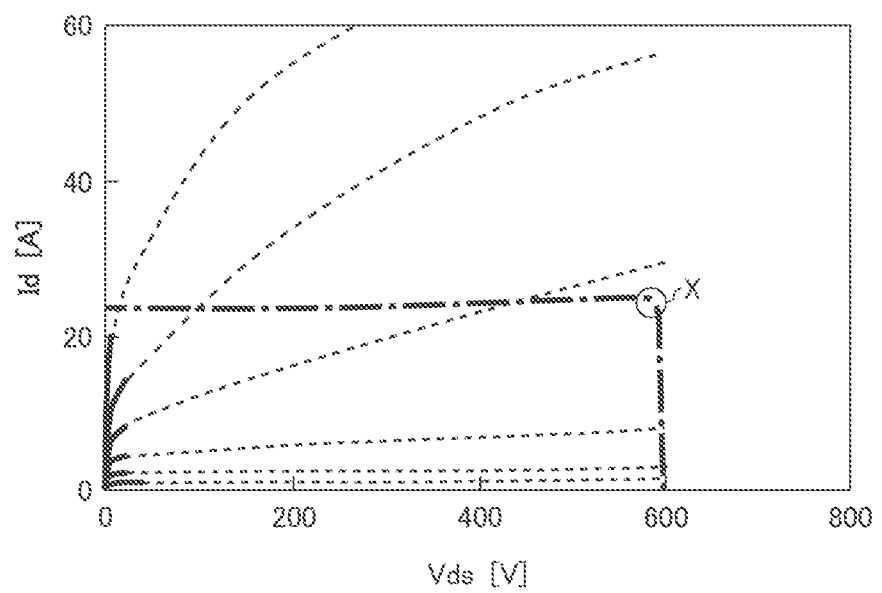
FIG. 13 is an Id-Vds characteristic diagram showing a measurement range of a curve tracer.

FIG. 12 is a timing chart showing a measurement sequence (i.e., an example of setting steps in the drain current Id) on the measurement device 10 of the second embodiment, depicting, from top down, the gate-source voltages Vgs and Vgs_sw, the drain-source voltage Vds, the respective on/off states of the transistors M1 and 16, and the drain currents Id (solid line) and Id_sw (broken line). In this embodiment, as the gate-source voltage, the control voltage VCTRL is shown.

Between time points t10 and t11 is a period corresponding to the excitation period (with a variable length T1) of the coil 12a. In this excitation period, while the transistor M1 is kept off, the transistor 16 is turned on so that an excitation current (i.e., the drain current Id_sw) passes through the coil 12a. Here, no drain current Id passes through the transistor M1, and thus no conduction loss or switching loss occurs.

Between time points t12 and t13 is a period corresponding to the measurement period (with a fixed length T0) for the transistor M1. In this measurement period, the transistor M1 is turned on so that the drain current Id set in the immediately preceding excitation period (between time points t10 and t11) passes, and meanwhile the gate-source voltage Vgs, the gate current Ig, and the drain current Id in the plateau region are measured individually.

Through the sequence described above, a first session of measurement (between time points t10 and t13) is complete.

Measurement can be continued by repeating a measurement sequence like that described above while securing sufficient intervals in between, resetting the excitation energy in the coil 12a, and varying the length of the excitation period (and hence the set value of the drain current Id).

Specifically, in terms of what is exemplarily shown in FIG. 12, when the excitation period occurs second time (between time points t14 an t15), its length is extended from the variable length T1 to a variable length T2 (>T1). Thu, measurement is performed with the current value of the drain current Id increased as compared in the first session of measurement. Also the third and later sessions of measurement are performed in a similar manner as described above; for example, when the excitation period occurs third time (between time points t18 and t19), its length is further increased from the variable length T2 to a variable length T3 (>T2). The measurement period can be kept at the fixed length T0 throughout.

As described above, with a measurement sequence in which the coil 12a is excited afresh not only when the excitation period occurs first time (between time points t10 an t11) but each time the set value of the drain current Id is changed, it is possible to measure Id-Vds characteristics accurately without causing a rise in the temperature of the transistor M1 as the DUT.

Application to IGBTs (Insulated-Gate Bipolar Transistors)

While the first and second embodiments described above deal with examples where the measurement target is a MOSFET, this is not meant to limit the target of measurement of current-voltage characteristics. Application is also possible, for example, in measurement of the current-voltage characteristics of an IGBT (i.e., the Ic-Vge characteristics that represent the relationship between the collector current Ic and the gate-emitter voltage Vge).

In that case, with respect to the names of the terminals, voltages, and currents associated with the transistor M1, "source" can be read as "emitter" and "drain" can be read as "collector".

Target of Application of an Excitation Current Bypass Mechanism

While the second embodiment (FIG. 10) deals with an example of application of a novel excitation current bypass mechanism (such as the transistor 16), this is not meant to limit the targets of application of an excitation current bypass mechanism. Suitable application is possible to methods for measurement of current-voltage characteristics in general that involve setting the drain current (or collector current) of a transistor as a DUT by passing an excitation current through an inductive load. For example, an excitation current bypass mechanism can be applied to the method disclosed in Patent Document 1. An excitation current bypass mechanism can be applied to a method for switching measurement of a target transistor where the rising time of the drain current is measured and thereby the current-voltage characteristics of the target transistor (e.g., a SiC-MOSFET) are acquired.

Further Modifications

The various technical features disclosed in the present specification can be implemented in any other manner than in the embodiments described above, and allow for many modifications without departing from the spirit of the technical ingenuity involved. That is, the embodiments descried above should be understood to be in every aspect illustrative and not restrictive. The technical scope of the present invention is defined not by the description of the embodiments given above but by the appended claims, and should be understood to encompass any modifications made in a sense and scope equivalent to those of the claims.

INDUSTRIAL APPLICABILITY

The methods for measurement of current-voltage characteristics disclosed in the present description can be employed, for example, in creating a device model of a power transistor (such as a SiC power transistor and a GaN power transistor) used in a high-current, high-voltage region.

REFERENCE SIGNS LIST 10, 10A measurement device
11 voltage source 12 current source
12a coil
13 diode
14 controller
15 gate resistor
16 N-channel MOS field-effect transistor (second transistor)
17 gate resistor
20 switching element
M1 N-channel MOS field-effect transistor (first transistor)
Rin internal gate resistor
Cgs gate-source parasitic capacitance
Cgd gate-drain parasitic capacitance
D1 body diode

The invention claimed is:

1. A method for measurement of current-voltage characteristics representing a relationship between a drain current (or collector current) and a drain-source voltage (or collector-emitter voltage) of a first transistor as a measurement target, the method comprising:
a first step of setting the drain current (or collector current) and the drain-source voltage (or collector-emitter voltage) using
a voltage source and a current source connected in series with the first transistor and
a rectifying element connected in parallel with, with a reverse polarity to, an inductive load serving as the current source;
a second step of measuring a gate-source voltage (or gate-emitter voltage) and a gate current in a switching transient state of the first transistor; and
a third step of calculating a voltage applied to a gate oxide film of the first transistor using results of the measurement of the gate-source voltage (or gate-emitter voltage) and the gate current and acquiring the current-voltage characteristics of the first transistor using a result of the calculation,
wherein
in the first step, during an excitation period in which an excitation current is passed through the inductive load, part of the excitation current is bypassed through a path that does not pass through the first transistor.

2. The method according to claim 1, wherein
while the first transistor is kept off, at least one second transistor connected in parallel with the first transistor is turned on and thereby the part of the excitation current is bypassed through the second transistor.

3. The method according to claim 2, wherein
the second transistor has a current capacity higher than a current capacity of the first transistor.

4. The method according to claim 1, wherein
the first and second steps are repeated while a length of the excitation period is varied.

5. The method according to claim 1, wherein
in a region of the switching transient state where the drain-source voltage (or collector-emitter voltage) varies, the gate-source voltage (or gate-emitter voltage), the gate current, and the drain current (or collector current) are measured individually.

6. The method according to claim 1, wherein
the voltage applied to the gate oxide film of the first transistor is calculated by subtracting from the gate-source voltage (or gate-emitter voltage) measured at a turn-on or turn-off time of the first transistor a result of multiplying the gate current measured at that turn-on or turn-off time of the first transistor by an internal gate resistance of the first transistor.

7. The method according to claim 1, wherein
the voltage applied to the gate oxide film of the first transistor is calculated using ratio of the gate-source voltages (or gate-emitter voltages) measured at both turn-on and turn-off times of the first transistor and the gate currents measured at both those turn-on and turn-off times of the first transistor.

8. The method according to claim 1, wherein
an approximation formula of the drain current (or collector current) with respect to the gate-source voltage (or gate-emitter voltage) is derived using a result of measurement of the drain current and a result of calculation of the voltage applied to the gate oxide film, and using the approximation formula, the current-voltage characteristics of the first transistor are acquired.

9. The method according to claim 1, wherein
the first transistor is a semiconductor device of which the current-voltage characteristics have a non-zero gradient even in a saturation region.

10. A measurement device configured to measure current-voltage characteristics of a first transistor using the method according to claim 1.

11. A method for creation of a device model, comprising:
parametrizing current-voltage characteristics of a first transistor measured by the method according to claim 1 and thereby creating a device model of the first transistor.

12. A measurement device comprising:
a voltage source and an inductive load as a current source that are connected in series with a transistor as a measurement target;
at least one switching element connected in parallel with the transistor; and
a controller configured to turn on and off the transistor and the switching element, the measurement device being configured to measure current-voltage characteristics representing a relationship between a drain current (or collector current) and a drain-source voltage (or collector-emitter voltage) of the transistor,
wherein
the controller is configured,
during an excitation period in which an excitation current is passed through the inductive load, to keep the transistor off and meanwhile turn the switching element on to pass the excitation current through the switching element and,
after the excitation period, to turn the switching element off and the transistor on to pass a current through the transistor to thereby enable measurement of the current-voltage characteristics of the transistor.

13. The measurement device according to claim 12, wherein
the transistor is a power (SiC) element through which a current of 20 A or more can be passed and the switching element has a permissible current capacity higher than a permissible current capacity of the transistor.

14. The measurement device according to claim 12, further comprising:
an externally connected gate resistor connected between the controller and a gate of the transistor.

* * * * *